(12) United States Patent
Bolle

(10) Patent No.: US 6,649,073 B2
(45) Date of Patent: Nov. 18, 2003

(54) METHOD FOR COMPENSATING FOR NONUNIFORM ETCH PROFILES

(75) Inventor: Cristian A Bolle, Bridgewater, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 150 days.

(21) Appl. No.: 10/010,570

(22) Filed: Nov. 13, 2001

(65) Prior Publication Data

US 2003/0089677 A1 May 15, 2003

(51) Int. Cl.⁷ .............................. H01L 21/00; B44C 1/22
(52) U.S. Cl. ................................. 216/26; 216/2; 216/41; 216/79; 216/11; 428/170; 438/719; 438/725
(58) Field of Search .................................. 216/2, 11, 24, 216/26, 41, 79, 80; 438/719, 723, 725; 428/170; 385/33; 359/642

(56) References Cited

FOREIGN PATENT DOCUMENTS

EP          0523861 A2   *   1/1993

* cited by examiner

Primary Examiner—William A. Powell
(74) Attorney, Agent, or Firm—Eugene J. Rosenthal

(57) ABSTRACT

Problems caused by a nonuniform processing profile are avoided by altering the area to be processed so as to compensate for the processing profile. More specifically, with regard to etching, problems caused by a nonuniform etch profile can be avoided by altering the mask employed in specifying the etch area so as to compensate for the etch profile. Nonuniform parameters of interest of structures which result from a nonuniform etch profile during the etching of a mask in which all the structures were identical can be avoided for by altering the mask employed in specifying the etch area so as to compensate for the etch profile. The mask is changed in a manner that is inversely proportional to the etch profile for each particular structure characteristic that determines the parameter of interest for which uniformity is desired.

19 Claims, 1 Drawing Sheet

METHOD FOR COMPENSATING FOR NONUNIFORM ETCH PROFILES

TECHNICAL FIELD

This invention relates to the art of etching materials to form an array of similar structures, and more particularly, to etching materials so that each of the various structures has a particular characteristic that varies in a prescribed manner across the array.

BACKGROUND OF THE INVENTION

A problem in the art of etching materials to forms structures is that the etchant, i.e., the substance which is causing the etching, may etch differently, e.g., at different rates or in a different direction, as a function of the type of material that is being etched and the location on the substrate which is being etched. The etch profile is a function of the conditions of the particular etch process employed. For example, using one particular type of chemistry employed for etching silicon with a gas plasma, photoresist nearer to an edge of a wafer is typically etched faster than photoresist nearer to the center of the wafer.

The variation of the etching across the substrate is called the etch profile. Furthermore, it may not be simply a variation in etch rate that is of concern, but instead it may be the variation in a ratio of the etching of different materials which are on the substrate, e.g., the ratio of the rate of etching of silicon to the rate of etching of photoresist, that is of concern. The variation of etch ratio across the substrate is a specific type of etch profile, called the etch ratio profile, which is really the result of combining two or more etch profiles.

The existence of a nonuniform etch profile, which is the general condition, is typically not desirable, because it causes the structures resulting from a uniform design, i.e., designed to be uniform in the presence of an assumed uniform etch profile, which is the only current design practice, to be not uniform, and hence to have different operating parameters. However, often uniform operating parameters are desired. For example, lens arrays are typically made by depositing uniformly sized disks of photoresist on silicon, flowing the photoresist into a lens shape, and then transferring the lens shape into the silicon by etching the silicon and photoresist simultaneously until the photoresist is completely etched. Disadvantageously, the nonuniform etch ratio profile for the etching of silicon to the rate of etching of photoresist will result in each lens having slightly different optical characteristics, e.g., different focal lengths, which is undesirable in optical communications applications that specify that each lens of the array must optically function substantially identically, because the lens-shaped photoresist is transferred into the silicon substrate at different rates over the wafer due to the nonuniformity of the etch profile of the ratio.

The same type of problem may also exist with other processing steps such as depositing, ion implantation, heat treatment, and irradiation, which each has their own associated processing profile which is analogous to an etch profile.

SUMMARY OF THE INVENTION

I have recognized that problems caused by a nonuniform processing profile can be avoided, in accordance with the principles of the invention, by altering the nature of the structures, i.e., some parameter thereof, in the area to be processed so as to compensate for the processing profile. More specifically, with regard to etching, I have recognized that problems caused by a nonuniform etch profile can be avoided, in accordance with the principles of the invention, by altering the mask employed in specifying the etch area so as to compensate for the etch profile.

In accordance with an aspect of the invention, with regard to etching, if desired, nonuniform parameters of interest of structures which result from a nonuniform etch profile during the etching of a mask in which all the structures were identical can be avoided by altering the mask employed in specifying the etch area so as to compensate for the etch profile. More specifically, the mask is changed in a manner that is inversely proportional to the etch profile for each particular structure characteristic that determines the parameter of interest for which uniformity is desired. Thus, for example, in the case of making lens arrays, the parameter of interest is the focal length, so long as each lens has a minimum diameter. To achieve a uniform focal length, the diameter and/or the height of the disks of photoresist is varied over the surface of the substrate. Varying the diameter is relatively easy to do, by varying the diameter of the disks on the mask. In order to achieve the same focal length for each lens in the array, assuming a uniform photoresist coating, the diameter of the disks has to be smaller in those regions where the etch ratio, e.g., the rate of etching of silicon as compared to the rate of etching of photoresist, is lower whereas the diameter of the disks has to be larger in those regions where the etch ratio is higher.

In accordance with another aspect of the invention, highly accurate intentionally nonuniform prescribed parameters can be achieved by employing a mask that not only has the desired nonuniform prescribed parameters as would result using an ideal uniform etch profile but has those parameters altered from their ideal desired values to compensate for the etching profile based on the location on the substrate at which the structure will be formed.

DETAILED DESCRIPTION

Figure 1:
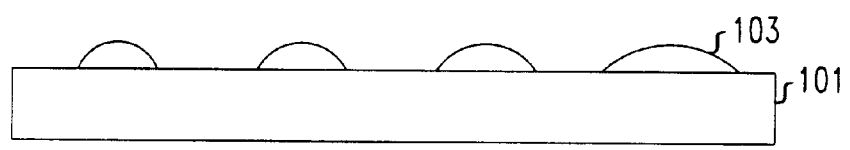
FIG. 1 shows substrate an exemplary having deposited thereon an array of element defining overlays in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the invention.

In the claims hereof any element expressed as a means for performing a specified function is intended to encompass any way of performing that function. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

Additionally, unless otherwise explicitly specified herein, any lens shown and/or described herein is actually an optical system having the particular specified properties of that lens. Such an optical system may be implemented by a single lens element but is not necessarily limited thereto. Similarly, where a mirror is shown and/or described what is actually being shown and/or described is an optical system with the specified properties of such a mirror, which may be implemented by a single mirror element but is not necessarily limited to a single mirror element. This is because, as is well known in the art, various optical systems may provide the same functionality of a single lens element or mirror but in a superior way, e.g., with less distortion. Furthermore, as is well known in the art, the functionality of a curved mirror may be realized via a combination of lenses and mirrors and vice versa. Moreover, any arrangement of optical components that are performing a specified function, e.g., an imaging system, gratings, coated elements, and prisms, may be replaced by any other arrangement of optical components that perform the same specified function. Thus, unless otherwise explicitly specified here, all optical elements or systems that are capable of providing specific function within an overall embodiment disclosed herein are equivalent to one another for purposes of the present disclosure.

In the description, identically numbered components within different ones of the FIGs. refer to the same components.

FIG. 1 shows exemplary substrate 101 having deposited thereon an array of element defining overlays 103. Substrate 101 may be any particular material that is suitable to the application of the implementer. For making lens arrays which are transparent to light in the 1.3 to 1.5 micron wavelengths, silicon may be employed.

Each of element defining overlays 103 is a type of material which is employed to control the etching of the substrate at the location underneath it. Element defining overlays 103 may be any type of material which will be selected by the implementer depending on the type of structure that is being made on the substrate. Those of ordinary skill in the art of making structures and devices on substrate will readily be able to determine an appropriate material for their particular application. For making lens arrays, it has been found that photoresist may be employed as a material for making element defining overlays.

For a lens array, the parameter of interest is the focal length. The focal length is controlled by the radius of curvature of the lens. Thus, it is desirable that each lens in the array have the same radius of curvature for an array with a uniform focal length or the radius needs to vary in a prescribed manner for an array with focal lengths that must vary in accordance with a prescribed function over the area of the array. How much of the lens surface area is available for light to pass through, i.e., the aperture, is not critical so long as each lens achieves the minimum required aperture and of course so long as it does not intersect with another lens.

As shown in FIG. 1, each of element defining overlays 103 has a different width but the same height, in accordance with an aspect of the invention, so as to produce an lens array with a uniform focal length. This may be easily achieved with conventional processing techniques. For example, a mask may be made so that different sized disks of photo resist are formed. Then, the disks are processed so that they flow into the lens shape that is shown in FIG. 1.

Those of element defining overlays 103 that have greater widths have a larger radius of curvature than those that have smaller widths. If the goal is for all of the lenses of the array to have an identical focal length, then it is a goal that the lenses have an identical radius of curvature. Therefore, in accordance with the principles, element defining overlays 103 are arranged such that the wider ones are located where the etch ratio is larger and the narrower ones are located where the etch ratio is smaller. More specifically, the width of element defining overlays 103 is directly related to the etch ratio profile. Of course, in order to determine the widths it is necessary to know a priori what is the etch ratio profile. Those of ordinary skill in the art are capable of determining the etch ratio profile, or any etch profile, for any material to be etched and any etchant. For example, using photo resist on silicon, and etching with a plasma gas, generally speaking, i.e., without specifying the exact function, the photo resist at the edges of the wafer are etched faster than the center of the substrate.

Figure 2:
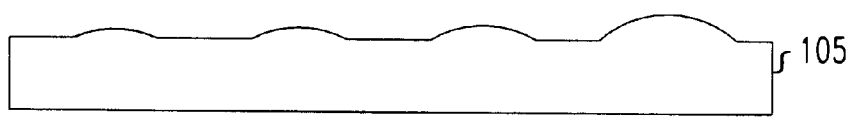
FIG. 2 shows an exemplary section of a uniform focal length lens array.

Thereafter the substrate and element defining overlays 103 are etched. Etching is allowed to proceed until the elements are formed and have the desired parameter being identical, if identicality is desired, or in accordance with the prescribed function, if it is so desired. For example, in making a uniform focal length lens array, the etching is allowed to proceed until all of the photoresist has been etched. An exemplary section of a uniform focal length lens array is shown in FIG. 2. Note that each lens has an identical radius of curvature, so that they each have an identical focal length, and it was possible to achieve this identicalness only because of the variation that was intentionally introduced in the widths of element defining overlays 103, which thus intentionally made element defining overlays 103 and, consequently, the resulting structures, different from each other, e.g., different ones of the lenses have different apertures, in that the lengths of the sections of the curve that are showing is different.

Other elements that can be varied include the depth and/or height of the element defining overlays, as well as the particular concentration of materials that make up the element defining overlays.

Although the foregoing exposition of the invention has been in terms of etching, those of ordinary skill in the art will recognize that the problem may also exist with other processing steps such as depositing, ion implantation, heat treatment, and irradiation, and that the solution to the problem embodied in the invention may equally be employed with such other processing steps which each has their own associated processing profile.

What is claimed is:

1. A method for manufacturing an array of structures over a substrate, so that a parameter of interest for each of said structures is substantially identical, the method comprising the steps of:

depositing an element defining overlay on said substrate for each structure in an array of structures thereby forming an array of element defining overlays, wherein at least one of said element defining overlays is intentionally not identical to at least one other of said element defining overlays; and processing said substrate with said element defining overlays thereon so that a parameter of interest of each of said elements as formed after said processing is identical for each of said structures on said substrate, said parameter of interest being a function of the attribute of said element defining overlay that makes said at least one element defining overlay intentionally different from said at least one other element defining overlay.

2. The invention as defined in claim 1 wherein said processing is at least one of the group consisting of etching, depositing, ion implantation, heat treatment, and irradiation.

3. The invention as defined in claim 1 wherein said structures are lenses.

4. The invention as defined in claim 1 wherein said structures are lenses and said parameter of interest is the focal distance of said lenses.

5. The invention as defined in claim 1 wherein said element defining overlay is comprised of photoresist.

6. The invention as defined in claim 1 wherein said substrate is silicon.

7. An apparatus comprising a plurality of nonidentical structures, each of said structures being made up of at least one element, said at least one element of each of said plurality of nonidentical structures being intentionally different so as to make said nonidentical structures nonidentical by design, said nonidentical structures having at least one parameter of interest that is identical and is a function of an attribute of said element which makes said elements intentionally different.

8. The invention as defined in claim 7 wherein said structures are lenses.

9. The invention as defined in claim 7 wherein said structures are lenses and said parameter of interest is the focal distance of said lenses.

10. A method for manufacturing an array of structures over a substrate, so that a parameter of interest for each of said structures varies over said substrate in accordance with a prescribed function, said prescribed function being different than any processing profile of materials used in any step of manufacturing said structure, the method comprising the steps of:

depositing an element defining overlay on said substrate for each structure in an array of structures thereby forming an array of element defining overlays, wherein at least one of said element defining overlays is intentionally not in accordance with said prescribed function given the position on said substrate of said at least one of said element defining overlays should a uniform etch rate be employed; and processing said substrate with said element defining overlays thereon so that a parameter of interest of each of said elements as formed after said processing varies in accordance with said prescribed function, said parameter of interest being a function of the attribute of said element defining overlay that makes said at least one element defining overlay intentionally not in accordance with said prescribed function.

11. The invention as defined in claim 10 wherein said prescribed function is a uniform function.

12. The invention as defined in claim 10 wherein said processing is at least one of the group consisting of etching, depositing, ion implantation, heat treatment, and irradiation.

13. The invention as defined in claim 10 structures are lenses.

14. The invention as defined in claim 10 structures are lenses and said parameter of interest is the focal distance of said lenses.

15. The invention as defined in claim 10 wherein said structures are lenses of a lens array, said parameter of interest is the focal length of said lenses, and said element defining overlays are photoresist.

16. The invention as defined in claim 10 wherein said element defining overlay is comprised of photoresist.

17. The invention as defined in claim 10 wherein said substrate is silicon.

18. An apparatus comprising a plurality of nonidentical structures on a substrate each having a parameter of interest, said parameter of interest varying over said substrate in accordance with prescribed function which is different than any processing profile of materials used in any step of manufacturing said structure, each of said structures being made up of at least one element, said at least one element of each of said plurality of nonidentical structures being intentionally different so as to make said nonidentical structures nonidentical by design, said at least one parameter of interest being a function of an attribute of said element which makes said structures intentionally different.

19. The invention as defined in claim 18 wherein said prescribed function is a uniform function, so that said parameter of interest of all of said structures are substantially the same.

* * * * *